(12) United States Patent
Wang

(10) Patent No.: US 11,611,354 B2
(45) Date of Patent: Mar. 21, 2023

(54) DATA ENCODING METHOD, DECODING METHOD, RELATED DEVICE, AND STORAGE MEDIUM

(71) Applicant: TCL China Star Optoelectronics Technology Co., Ltd., Shenzhen (CN)

(72) Inventor: Fuyi Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 40 days.

(21) Appl. No.: 16/618,146

(22) PCT Filed: Jul. 29, 2019

(86) PCT No.: PCT/CN2019/098115
§ 371 (c)(1),
(2) Date: Nov. 28, 2019

(87) PCT Pub. No.: WO2020/206875
PCT Pub. Date: Oct. 15, 2020

(65) Prior Publication Data
US 2022/0029635 A1    Jan. 27, 2022

(30) Foreign Application Priority Data
Apr. 8, 2019  (CN) .......................... 201910277375.5

(51) Int. Cl.
*H03M 7/00*       (2006.01)
*H03M 5/06*       (2006.01)
(Continued)

(52) U.S. Cl.
CPC .............. *H03M 5/06* (2013.01); *H03K 19/20* (2013.01); *H03M 7/40* (2013.01)

(58) Field of Classification Search
CPC ............ H03M 5/06; H03M 7/40; H03M 5/14; H03K 19/20
(Continued)

(56) References Cited

U.S. PATENT DOCUMENTS 4,539,684 A * 9/1985 Kloker ................... H04L 7/048
714/788
5,832,037 A * 11/1998 Park ....................... H03M 7/30
375/240

(Continued)

FOREIGN PATENT DOCUMENTS

CN         1213833 A    4/1999
CN       101847997 A    9/2010
(Continued)

*Primary Examiner* — Jean B Jeanglaude
(74) *Attorney, Agent, or Firm* — PV IP PC; Wei Te Chung; Ude Lu

(57) ABSTRACT

The present disclosure provides a data encoding method, a decoding method, a related device, and a storage medium. The data encoding method first passes a first bit stream of an original encoded data through a logical operation to obtain a second bit stream. Then, through signal determination, negating processing, and insertion of corresponding flag bit, encoded data having a certain jump amplitude is obtained. A problem that signal is prone to error in transmission process is solved, reliability of coding is improved, and signal transmission is facilitated.

20 Claims, 3 Drawing Sheets

(51) Int. Cl.
*H03K 19/20* (2006.01)
*H03M 7/40* (2006.01)

(58) Field of Classification Search
USPC .......................................................... 341/51
See application file for complete search history.

(56) References Cited

U.S. PATENT DOCUMENTS

| | | | |
|---|---|---|---|
| 6,075,735 A | 6/2000 | Sugibayashi | |
| 6,275,587 B1 * | 8/2001 | Amerige | H04L 9/34 380/255 |
| 6,844,834 B2 * | 1/2005 | Maruya | G06F 9/30025 341/60 |
| 8,392,174 B2 * | 3/2013 | Cameron | G06F 40/00 704/7 |
| 9,218,319 B2 * | 12/2015 | Cameron | H03M 7/00 |
| 2002/0002412 A1 | 1/2002 | Gunji | |
| 2004/0021591 A1 * | 2/2004 | Maruya | G06F 9/30032 341/60 |
| 2004/0218679 A1 | 11/2004 | Luna et al. | |
| 2008/0033974 A1 * | 2/2008 | Cameron | G06F 40/221 |
| 2008/0040345 A1 * | 2/2008 | Cameron | G06F 7/02 |
| 2008/0046686 A1 * | 2/2008 | Cameron | G06F 9/3885 712/E9.002 |
| 2009/0278715 A1 * | 11/2009 | Fenney | H04N 19/61 341/51 |
| 2013/0144895 A1 * | 6/2013 | Cameron | G06F 16/83 707/755 |
| 2015/0116136 A1 * | 4/2015 | Cameron | G06F 16/83 341/55 |

FOREIGN PATENT DOCUMENTS

| | | |
|---|---|---|
| CN | 102497249 A | 6/2012 |
| CN | 105072058 A | 11/2015 |
| CN | 106411322 A | 2/2017 |
| CN | 108847916 A | 11/2018 |
| CN | 109309548 A | 2/2019 |
| CN | 109525372 A | 3/2019 |
| EP | 1711016 A2 | 10/2006 |

* cited by examiner

DATA ENCODING METHOD, DECODING METHOD, RELATED DEVICE, AND STORAGE MEDIUM

FIELD OF DISCLOSURE

The present disclosure relates to the data encoding technology field, and in particular, relates to a data encoding method, a decoding method, a related device, and a storage medium.

BACKGROUND OF DISCLOSURE

Digital signal encoding techniques are designed to transform binary 0/1 digital data into square wave waveforms with polarity, amplitude, bit rate, and hopping rules. While the signal is in the process of serial transmission, the transmitted data can be encoded into a code stream containing a clock frequency component, so that the receiver can extract clock synchronization information from the code stream. The clock synchronization information can ensure that the receiver reproduces the original data from the received signal according to the correct timing. However, when there is an excessive number of consecutive zeros or consecutive ones in the signal, phase shift or frequency deviation easily occurs when the receiver recovers data. This type of error is called bit error.

In the existing data transmission technology, the signal is prone to error in the transmission process. So far, there is no effective solution.

SUMMARY OF THE DISCLOSURE

An embodiment of the present disclosure provides a data encoding method, a decoding method, a related device, and storage medium, which solve the problem that the signal is prone to error in the transmission process, improves the reliability of the encoding, and facilitates signal transmission.

To achieve the above objects, in a first aspect, the present disclosure provides a data encoding method, and the data encoding method comprises steps: obtaining a first bit stream of original encoded data; performing a preset logical operation according to the first bit stream to obtain a second bit stream, wherein a number of bits of the second bit stream is larger than that of the first bit stream; determining whether logical values of a plurality of consecutive preset bits in the second bit stream are the same, wherein if the logical values are the same, a logical negation is performed on the logical value of at least one bit in the middle position of the consecutive preset bits to obtain a third bit stream; and negating a target bit in the third bit stream as a flag bit, and inserting the flag bit into a first bit of the third bit stream to obtain encoded data.

In the present disclosure, the target bit is inserted as the flag bit into a first bit of the second bit stream to obtain the coded data when the logical values of the consecutive preset bits in the second bit stream are different.

In the present disclosure, the first bit stream are 8-bit data, the second bit stream are 9-bit data, and the step of performing the preset logical operation according to the first bit stream to obtain the second bit stream includes: assigning a first bit of the first bit stream to a first bit of the second bit stream; assigning a second bit of the first bit stream to a second bit of the second bit stream; negating the second bit of the first bit stream, and assigning the second bit of the first bit stream to a third bit of the second bit stream; assigning a third bit of the first bit stream to a fourth bit of the second bit stream; negating a sixth bit of the first bit stream, and assigning the sixth bit of the first bit stream to a seventh of the second bit stream; and performing a preset logical operation according to the first bit stream to obtain a fifth bit, a sixth bit, an eighth bit, and a ninth bit of the second bit stream.

In the present disclosure, the step of performing the preset logic operation according to the first bit stream to obtain the fifth bit, the sixth bit, the eighth bit, and the ninth bit of the second bit stream includes: performing a plurality of logical operations on the first bit, the second bit, and the fourth bit of the first bit stream, respectively, performing a logical OR operation on a result of the logical operations, and taking a result of the logical OR operation as the fifth bit of the second bit stream; performing a plurality of logical operations on the first bit, the second bit, and the fifth bit of the first bit stream, respectively, performing a first logical OR operation on a result of the logical operations, and taking a result of the first logical OR operation as the sixth bit of the second bit stream; performing a plurality of logical operations on the first bit, the second bit, and the seventh bit of the first bit stream, respectively, performing a second logical OR operation on a result of the logical operations, and taking a result of the second logical OR operation as the eighth bit of the second bit stream; and performing a plurality of logical operations on the first bit, the second bit, and the eighth bit of the first bit stream, respectively, performing a third logical OR operation on a result of the logical operations, and taking a result of the third logical OR operation as the ninth bit of the second bit stream.

In the present disclosure, the step of determining whether logical values of the consecutive preset bits in the second bit stream are the same includes: performing a logical NAND operation on the values of the consecutive preset bits to obtain a first operation result; performing a logical OR operation on the values of the consecutive preset bits to obtain a second operation result; and performing a logical AND operation on the first operation result and the second operation result to obtain a third operation result; wherein the logical values of the consecutive preset bits are different when the third operation result is 1, and the logical values of the consecutive preset bits are the same when the first operation result is 0.

In the present disclosure, the consecutive preset bits in the second bit stream are a plurality of consecutive preset bits in the middle of the second bit stream.

In the present disclosure, the consecutive preset bits in the second bit stream are a plurality of consecutive preset bits in the middle and lower bit of the second bit stream.

In a second aspect, the present disclosure provides a data decoding method, and the data decoding method comprises steps of: obtaining a first bit stream corresponding to original data to be decoded; obtaining flag bit information in the first bit stream; obtaining preset bit information of encoding and negating processing in the first bit stream when a value of a flag bit is a value of a target bit in the first bit stream negated; performing a negating processing on a preset bit in the first bit stream to obtain a second bit stream; and performing a preset logical operation according to the second bit stream and removing the flag bit to obtain decoded data, wherein a number of bits of the decoded data are longer than that of the second bit stream.

In the present disclosure, the data decoding method further includes a preset logical operation is performed according to the first bit stream, and the flag bit is removed to obtain decoded data when the value of the flag bit is a value of a target bit in the first bit stream.

In a third aspect, the present disclosure provides a data encoding device, and the data encoding device comprises an obtaining unit configured to obtain a first bit stream of original encoded data; a logical operation unit configured to perform a preset logical operation according to the first bit stream to obtain a second bit stream, wherein bits of the second bit stream are more than bits of the first bit stream; and an encoding unit configured to determine whether logical values of a plurality of consecutive preset bits in the second bit stream are the same, wherein if the logical values are the same, a logical negation is performed on the logical value of at least one bit in the middle position of the consecutive preset bits to obtain a third bit stream, and negate a target bit in the third bit stream as a flag bit, and inserting the flag bit into a first bit of the third bit stream to obtain encoded data.

In the present disclosure, the first bit stream are 8-bit data, the second bit stream are 9-bit data, and the encoding unit is further configured to: perform that the target bit is inserted as the flag bit into a first bit of the second bit stream to obtain the coded data when the logical values of the consecutive preset bits in the second bit stream are different.

In the present disclosure, the logical operation unit is specifically configured to: assign a first bit of the first bit stream to a first bit of the second bit stream; assign a second bit of the first bit stream to a second bit of the second bit stream; negating the second bit of the first bit stream, and assign the second bit of the first bit stream to a third bit of the second bit stream; assign a third bit of the first bit stream to a fourth bit of the second bit stream; negate a sixth bit of the first bit stream, and assign the sixth bit of the first bit stream to a seventh of the second bit stream; and perform a preset logical operation according to the first bit stream to obtain a fifth bit, a sixth bit, an eighth bit, and a ninth bit of the second bit stream.

In the present disclosure, the logical operation unit is specifically configured to: perform a plurality of logical operations on the first bit, the second bit, and the fourth bit of the first bit stream, respectively, perform a logical OR operation on a result of the logical operations, and take a result of the logical OR operation as the fifth bit of the second bit stream; perform a plurality of logical operations on the first bit, the second bit, and the fifth bit of the first bit stream, respectively, perform a first logical OR operation on a result of the logical operations, and take a result of the first logical OR operation as the sixth bit of the second bit stream; perform a plurality of logical operations on the first bit, the second bit, and the seventh bit of the first bit stream, respectively, perform a second logical OR operation on a result of the logical operations, and take a result of the second logical OR operation as the eighth bit of the second bit stream; and perform a plurality of logical operations on the first bit, the second bit, and the eighth bit of the first bit stream, respectively, perform a third logical OR operation on a result of the logical operations, and take a result of the third logical OR operation as the ninth bit of the second bit stream.

In the present disclosure, the encoding unit is specifically configured to: perform a logical NAND operation on the values of the consecutive preset bits to obtain a first operation result; perform a logical OR operation on the values of the consecutive preset bits to obtain a second operation result; and performing a logical AND operation on the first operation result and the second operation result to obtain a third operation result; wherein the logical values of the consecutive preset bits are different when the third operation result is 1, and the logical values of the consecutive preset bits are the same when the first operation result is 0.

In the present disclosure, the consecutive preset bits in the second bit stream are a plurality of consecutive preset bits in the middle of the second bit stream.

In the present disclosure, the consecutive preset bits in the second bit stream are a plurality of consecutive preset bits in the middle and lower bit of the second bit stream.

In the present disclosure, the data encoding device includes a first obtaining unit configured to obtain a fourth bit stream corresponding to original data to be decoded; a second obtaining unit configured to obtain flag bit information in the fourth bit stream; a third obtaining unit configured to obtain preset bit information of codding and negating processing in the fourth bit stream when a value of a flag bit is a value of a target bit in the fourth bit stream negated; and a decoding unit configured to perform a negating processing on a preset bit in the fourth bit stream to obtain a fifth bit stream, and perform a preset logical operation according to the fifth bit stream and removing the flag bit to obtain decoded data, wherein a number of the bits of the decoded data is larger than that of the fifth bit stream.

In the present disclosure, the decoding unit is configured to: perform that a preset logical operation is performed according to the fourth bit stream, and the flag bit is removed to obtain decoded data when the value of the flag bit is a value of a target bit in the fourth bit stream.

In the present disclosure, the preset bits in the fourth bit stream are a plurality of consecutive preset bits.

In the present disclosure, the preset bits in the fourth bit stream are a plurality of consecutive preset bits being lower bits.

In a fourth aspect, the present disclosure provides a data decoding device, and the data decoding device comprises a first obtaining unit configured to obtain a first bit stream corresponding to original data to be decoded; a second obtaining unit configured to obtain flag bit information in the first bit stream; a third obtaining unit configured to obtain preset bit information of codding and negating processing in the first bit stream when a value of a flag bit is a value of a target bit in the first bit stream negated; and a decoding unit configured to perform a negating processing on a preset bit in the first bit stream to obtain a second bit stream, and perform a preset logical operation according to the second bit stream and remove the flag bit to obtain decoded data, wherein a number of the bits of the decoded data is larger than that of the second bit stream.

In the present disclosure, the decoding unit is configured to: perform that a preset logical operation is performed according to the first bit stream, and the flag bit is removed to obtain decoded data when the value of the flag bit is a value of a target bit in the first bit stream.

In a fifth aspect, the present disclosure further provides a storage medium, the storage medium stores a plurality of instructions. The instructions are adapted to be loaded by a processor to perform any of steps of the data encoding method of the first aspect, or any of steps of the data decoding method of the second aspect.

In the embodiment of the present disclosure, by converting the first bit stream of the original encoded data into encoded data. First, the first bit stream of the original encoded data is passed through a preset logic operation to obtain a second bit stream. Then, through signal determination, negating processing, and insertion of corresponding flag bit, a encode having a certain jump amplitude and consecutive 0 or 1 numbers less than the number of the consecutive preset bits is obtained. The problem that the signal is prone to error in the transmission process is solved, the reliability of the encoding is improved, and the signal transmission is facilitated.

DESCRIPTION OF DRAWINGS

In order to more clearly illustrate technical solutions in the embodiments of the present disclosure, the drawings used in the description of the embodiments will be briefly introduced below. Obviously, the drawings in the following description are only some embodiments of the present disclosure, and those of ordinary skill in the art can also obtain other drawings based on these drawings without making creative effort.

DETAILED DESCRIPTION OF PREFERRED EMBODIMENTS

Figure 1:
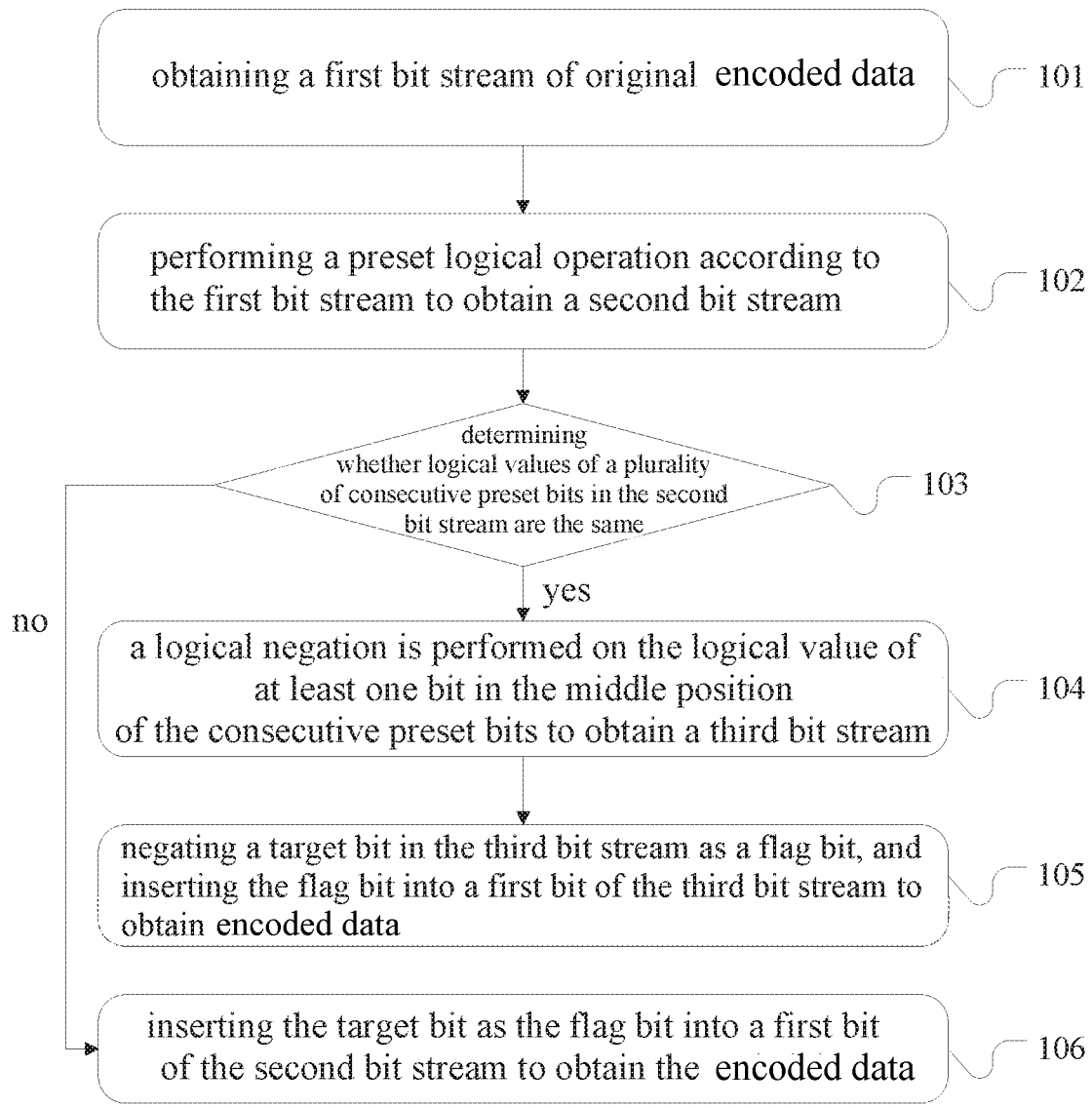
FIG. 1 is a flow chart of a data encoding method according to an embodiment of the present disclosure.

A clear and full description of the technical schemes of the embodiments of the disclosure will be given in combination with the drawings of the embodiments of the disclosure as follows. Obviously, the described embodiments are just a part rather than the whole of the embodiments of the disclosure. Based on the embodiments of the disclosure, any other embodiments obtained by a person skilled in the art without any creative work will fall within the protection scope of the disclosure.

In the description of the present disclosure, it is to be understood that terms such as "central", "upper", "lower", "front", "rear", "left", "right", "vertical", "horizontal", "top", "bottom", "inner", "outer", etc. should be construed to refer to the orientation or position as shown in the drawings under discussion. These relative terms are for convenience of description and do not indicate or imply that the apparatus or members must have a particular orientation or be constructed and operated in a particular orientation. Therefore, these terms shall not be construed to limit the present disclosure. In addition, terms such as "first" and "second" are used herein for purposes of description and are not intended to indicate or imply relative importance or to imply the number of indicated technical features. Thus, the feature defined with "first" and "second" may explicitly or implicitly include one or more of this feature. Furthermore, in the description of the present disclosure, "a plurality of" means two or more than two, unless specified otherwise.

In the present disclosure, the word "exemplary" is used herein to mean serving as an example, instance, or illustration. Any aspect or design described herein as "exemplary" is not necessarily to be construed as preferred or advantageous over other aspects or designs. The following description is presented to enable any person skilled in the art to make and use the present disclosure. In the following description, details are set forth for the purpose of explanation. It will be appreciated that one skilled in the art will recognize that the present disclosure can be practiced without the specific details. In other instances, well-known structures and procedures are not described in detail to avoid unnecessary detail. Therefore, the present disclosure is not intended to be limited to the embodiments shown, but is in accordance with the broad scope of the principles and features disclosed herein.

Generally, when transmitting data between a transmitter (TX) and a receiver (RX), a mechanism for transmitting/receiving data and a mechanism for transmitting/receiving clock information are required. When transmitting data on a high-speed interface, in order to improve signal transmission quality, reduce electromagnetic interference (EMI), provide error correction, and save clock circuits, the data to be transmitted is generally encoded to satisfy above needs. In the existing data transmission technology, error is still prone to occur in the transmission process after the signal coding. So far, there is no effective solution.

Based on the above, an embodiment of the present disclosure provides a data encoding method, a decoding method, a related device, and a storage medium. The details are described below separately.

First, the embodiment of the present disclosure provides a data encoding method. The data encoding method includes steps of: obtaining a first bit stream of original encoded data; performing a preset logical operation according to the first bit stream to obtain a second bit stream, wherein a number of bits of the second bit stream is larger than that of the first bit stream; determining whether logical values of a plurality of consecutive preset bits in the second bit stream are the same, wherein if the logical values are the same, a logical negation is performed on the logical value of at least one bit in the middle position of the consecutive preset bits to obtain a third bit stream; and negating a target bit in the third bit stream as a flag bit, and inserting the flag bit into a first bit of the third bit stream to obtain encoded data.

Referring to FIG. 1, a flow chart of a data encoding method according to an embodiment of the present disclosure is illustrated. The method includes:

101, a first bit stream of original encoded data is obtained.

Specifically, the original encoded data may be data transmitted from a transmitter (TX) to a receiver (RX), wherein the original encoded data is in the form of a bit stream, for example, when the first bit stream is 8-bit data, such as 00111100.

102, a preset logical operation is performed according to the first bit stream to obtain a second bit stream.

Wherein, a number of bits of the second bit stream is greater than that of the first bit stream. For example, the first bit stream is 8-bit data, and the second bit stream is 9-bit data. It can be understood that in other embodiments of the present disclosure, the first bit stream and the second bit stream may also be other bits of data, as long as the number of bits of the second bit stream is greater than the number of bits of the first bit stream, which is not limited herein.

103, whether logical values of a plurality of consecutive preset bits in the second bit stream are the same is determined, wherein if the logical values are the same, step 104 is performed. If not, step 106 can be performed.

Specifically, the consecutive preset bits in the second bit stream may be a plurality of consecutive preset bits in the lower bit of the second bit stream, or may be consecutive preset bits in the middle, or may be consecutive preset bits in the upper. This is not limited here. In addition, a plurality of consecutive preset bits can be set as needed, for example, three or the like.

104, a logical negation is performed on the logical value of at least one bit in the middle position of the consecutive preset bits to obtain a third bit stream.

The number of consecutive preset bits may be an odd number, so that the logical value of at least one bit of the middle position is selected in the consecutive preset bits for negating processing. The logic value of at least one bit in the middle position of the consecutive preset bits can be set according to the number of consecutive preset bits. For example, the number of the consecutive preset bits is n, n=2m+1, n≥3, where n and m are both positive integers, and the number of the at least one bit is m. Specifically, when the number of consecutive preset bits is 3, one bit can be selected for negating processing. The 1 bit can be a bit in the middle position of the consecutive preset bits. When the number of consecutive preset bits is 5, 2 bits can be selected for negating processing, and so on.

105, a target bit in the third bit stream is negated as a flag bit, and the flag bit is inserted into a first bit of the third bit stream to obtain encoded data.

106, the target bit is inserted as the flag bit into a first bit of the second bit stream to obtain the coded data.

In the embodiment of the present disclosure, by converting the first bit stream of the original encoded data into encoded data. First, the first bit stream of the original encoded data is passed through a preset logic operation to obtain a second bit stream. Then, through signal determination, negating processing, and insertion of corresponding flag bit, a code having a certain jump amplitude and consecutive number of 0 or 1 that is less than the number of the consecutive preset bits is obtained. The problem that the signal is prone to error in the transmission process is solved, the reliability of the encoding is improved, and the signal transmission is facilitated.

In the embodiment of the present disclosure, the first bit stream may be 8-bit data, the second bit stream is 9-bit data, and the step of performing the preset logical operation according to the first bit stream to obtain the second bit stream includes: assigning a first bit of the first bit stream to a first bit of the second bit stream; assigning a second bit of the first bit stream to a second bit of the second bit stream; negating the second bit of the first bit stream, and assigning the second bit of the first bit stream to a third bit of the second bit stream; assigning a third bit of the first bit stream to a fourth bit of the second bit stream; negating a sixth bit of the first bit stream, and assigning the sixth bit of the first bit stream to a seventh of the second bit stream; and performing a preset logical operation according to the first bit stream to obtain a fifth bit, a sixth bit, an eighth bit, and a ninth bit of the second bit stream.

Specifically, the step of performing the preset logic operation according to the first bit stream to obtain the fifth bit, the sixth bit, the eighth bit, and the ninth bit of the second bit stream includes: performing a plurality of logical operations on the first bit, the second bit, and the fourth bit of the first bit stream, respectively, performing a logical OR operation on a result of the logical operations, and taking a result of the logical OR operation as the fifth bit of the second bit stream; performing a plurality of logical operations on the first bit, the second bit, and the fifth bit of the first bit stream, respectively, performing a first logical OR operation on a result of the logical operations, and taking a result of the first logical OR operation as the sixth bit of the second bit stream; performing a plurality of logical operations on the first bit, the second bit, and the seventh bit of the first bit stream, respectively, performing a second logical OR operation on a result of the logical operations, and taking a result of the second logical OR operation as the eighth bit of the second bit stream; and performing a plurality of logical operations on the first bit, the second bit, and the eighth bit of the first bit stream, respectively, performing a third logical OR operation on a result of the logical operations, and taking a result of the third logical OR operation as the ninth bit of the second bit stream.

In the following, the first bit stream may be 8-bit data, and the second bit stream is 9-bit data. In combination with a specific embodiment, a preset bit logic operation is performed according to the first bit stream to obtain the second bit stream for detailed description.

First, the first bit stream is directly assigned by the following logical operation, and the 8-bit data is encoded into 9-bit data. The specific coding mechanism is as follows:

Bn[0]=bm[0]; (the first bit of the first bit stream is assigned the first bit of the second bit stream)

Bn[1]=bm[1]; (the second bit of the first bit stream is assigned the second bit of the second bit stream)

Bn[2]=~bm[1]; (after the second bit of the first bit stream is negated, the value is assigned to the third bit of the second bit stream)

Bn[3]=bm[2]; (the third bit of the first bit stream is assigned the fourth bit of the second bit stream)

Bn[4]=~((bm[3]&~bm[1]&~bm[0])|(~bm[3]&~bm[1]&bm[0])|(bm[3]&bm [1]&bm[0])|(~bm[3]&bm[1]&~bm[0])); (the negating first bit of the first bit stream, the negating second bit of the first bit stream, and the fourth bit of the first bit stream are performed a logical AND operation; the first bit of the first bit stream, the negating second bit of the first bit stream, and the negating fourth bit of the first bit stream are performed a logical AND operation; the first bit of the first bit stream, the second bit of the first stream, and the fourth bit of the first bit stream are performed a logical AND operation; the negating first bit of the first bit stream, the second bit of the first stream, and the negating fourth bit of the first bit stream are performed a logical AND operation; then the result of the above four logical AND operations are performed a logical OR operation, and the result of the logical OR operation is taken as the fifth bit of the second bit stream bn[4])

bn[5]=(bm[4]&~bm[1]&~bm[0])|(~bm[4]&~bm[1]&bm[0])|(bm[4]&bm[1]&bm[0])|(~bm[4]&bm[1]&~bm[0]);
(the negating first bit of the first bit stream, the negating second bit of the first bit stream, and the fifth bit of the first bit stream are performed a logical AND operation; the first bit of the first bit stream, the negating second bit of the first bit stream, and the negating fifth bit of the first bit stream are performed a logical AND operation; the first bit of the first bit stream, the second bit of the first bit stream, and the fifth bit of the first bit stream are performed a logical AND operation; the negating first bit of the first bit stream, the second bit of the first bit stream, and the negating fifth bit of the first bit stream are performed a logical AND operation; then the result of the above four logical AND operations are performed a logical OR operation, and the result of the logical OR operation is taken as the sixth bit of the second bit stream bn[5])

Bn[6]=~bm[5]; (after the sixth bit of the first bit stream is negated, and the value is assigned to the seventh bit of the second bit stream)

bn[7]=~((bm[6]&~bm[1]&~bm[0])(~bm[6]&~bm[1]&bm[0])|(bm[6]&bm [1]&bm[0])|(~bm[6]&bm[1]&~bm[0])); (the negating first bit of the first bit stream, the negating second bit of the first bit stream, and the seventh bit of the first bit stream are performed a logical AND operation; the first bit of the first bit stream, the negating second bit of the first bit stream, and the negating seventh bit of the first bit stream are performed a logical AND operation; the first bit of the first bit stream, the second bit of the first bit stream, and the seventh bit of the first bit stream are performed a logical AND operation; the negating first bit of the first bit stream, the second bit of the first bit stream, and the negating seventh bit of the first bit stream are performed a logical AND operation; then the result of the above four logical AND operations are performed a logical OR operation, and the result of the logical OR operation is taken as the eighth bit of the second bit stream bn[7])

bn[8]=(bm[7]&~bm[1]&~bm[0])|(~bm[7]&~bm[1]&bm[0])|(bm[7]&bm[1]&bm[0])|(~bm[7]&bm[1]&~bm[0]);

(the negating first bit of the first bit stream, the negating second bit of the first bit stream, and the eighth bit of the first bit stream are performed a logical AND operation; the first bit of the first bit stream, the negating second bit of the first bit stream, and the negating eighth bit of the first bit stream are performed a logical AND operation; the first bit of the first bit stream, the second bit of the first bit stream, and the eighth bit of the first bit stream are performed a logical AND operation; the negating first bit of the first bit stream, the second bit of the first bit stream, and the negating eighth bit of the first bit stream are performed a logical AND operation; then the result of the above four logical AND operations are performed a logical OR operation, and the result of the logical OR operation is taken as the ninth bit of the second bit stream bn[8])

Wherein, bm[0-7] is the original 8-bit encoded data, that is, the first bit stream, bn[0-8] is the converted 9-bit data, that is, the second bit stream is obtained. Negating a bit indicates the value of the bit after it is negated. For example, the first bit is negated by ~bm[1], indicating the value after the first bit is negated.

In the embodiment of the present disclosure, the step 103 of determining whether logical values of the consecutive preset bits in the second bit stream are the same includes: performing a logical NAND operation on the values of the consecutive preset bits to obtain a first operation result; performing a logical OR operation on the values of the consecutive preset bits to obtain a second operation result; and performing a logical AND operation on the first operation result and the second operation result to obtain a third operation result; wherein the logical values of the consecutive preset bits are different when the third operation result is 1, and the logical values of the consecutive preset bits are the same when the first operation result is 0.

Specifically, the following describes in detail a case where preset bits are 3-bits, and a second bit stream is 9-bits of data. Assume that the second bit stream is End[1~9], whether the logical values of the consecutive preset bits in the second bit stream are the same is determined to determine that the logical values of the sixth to eighth bits in the second bit stream are the same. The following logical expression can be used:

AND(NAND(End[6~8]), OR(End[6~8]))

When the sixth bit to the eighth bit of the second bit stream are both 1, NAND(End[6~8]) is 0;

When the sixth bit to the eighth bit of the second bit stream are both 0, OR(End[6~8]) is 0;

The above logical expression is 1, which means that the logical values of the sixth bit to the eighth bit of the second bit stream are different, that is, 0 or 1 at the same time, and the coding quality standard is satisfied, and the flag bit can be directly inserted. If the above logical expression is 0, it means that the logical value of the sixth bit to the eighth bit of the second bit stream are the same, then the seventh bit of the second bit stream is negated, and the flag bit is inserted.

It should be noted, in the embodiment of the present disclosure, when the logical values of consecutive preset bits in the second bit stream are the same or different, different flag bits may be inserted. For example, when the logical values of the consecutive preset bits in the second bit stream are the same, the target bit may be inserted as a flag bit into the first bit stream to obtain encoded data. When the logical values of the consecutive preset bits in the second bit stream are different, the target bit in the third bit stream may be negated and inserted as a flag bit into the first bit stream to obtain encoded data.

Figure 2:
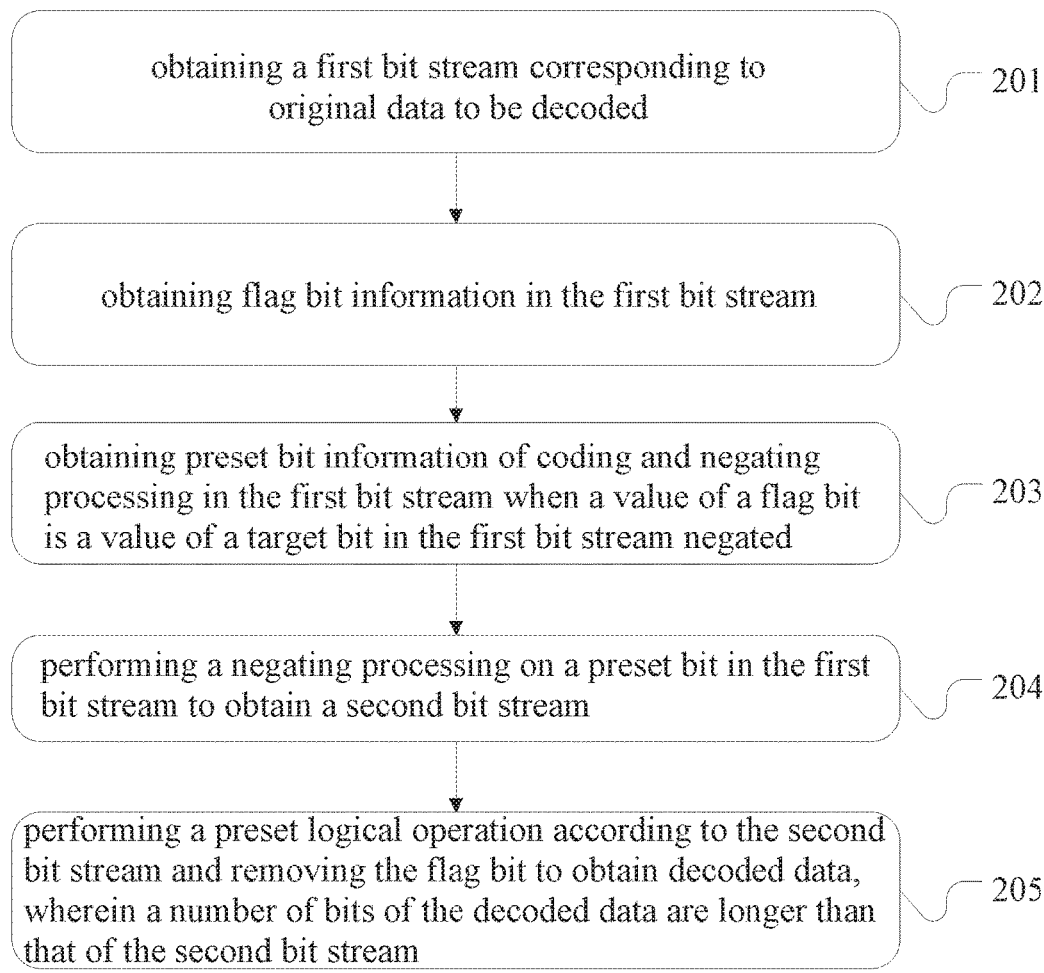
FIG. 2 is a flow chart of a data decoding method according to an embodiment of the present disclosure.

In order to better implement the data encoding method in the embodiment of the present disclosure, Correspondingly, based on the data encoding method, as shown in FIG. 2, the embodiment of the present disclosure further provides a data decoding method, where the data decoding method includes:

201, a first bit stream corresponding to original data to be decoded is obtained. Specifically, the original data to be decoded may be data transmitted from a receiver (RX) to a transmitter (TX). The original data to be decoded may be in the form of a bit stream, for example, when the first bit stream is 10-bit data, such as 0011110011.

202, the flag bit information in the first bit stream is obtained. Specifically, the flag bit information may be a value of "0" or "1" as described in the data encoding method.

203, preset bit information of encoding and negating processing in the first bit stream is obtained when a value of a flag bit is a value of a target bit in the first bit stream negated.

Wherein, the preset bit information may be set according to a method corresponding to the data encoding method. For example, when there are three consecutive bits in the data encoding method, the preset bit information is a bit between the three bits. For example, in the data encoding method, the consecutive plurality of bits End[6~8] are 111 respectively, and the corresponding bit stream of the decoded data is 101 (the middle position of the bit is negating processing), and in the first bit stream. This preset bit is the middle 0.

204, a negating processing is performed on a preset bit in the first bit stream to obtain a second bit stream.

Specifically, in the data decoding method, the preset bit in the first bit stream is negating processing to obtain a second bit stream. Taking step 203 as an example, in the first bit stream of the corresponding decoded data in the data decoding method, it is 101 (the middle position of bit is negated). In the first bit stream, the preset bit is the middle 0, and the "0" is negated and restored to "1" to obtain the second bit stream.

205, a preset logical operation is performed according to the first bit stream, and the flag bit is removed to obtain decoded data, wherein a number of bits of the decoded data is greater than that of the second bit stream.

In the embodiment of the present disclosure, the logic operation performed according to the second bit stream may adopt the opposite logic operation mode in the foregoing data encoding method embodiment (performing a preset logic operation based on the first bit stream to obtain a second bit stream). It will not be described in detail here.

In addition, in the embodiment of the present disclosure, performing a preset logical operation according to the second bit stream may be performed before the flag bit is removed. Alternatively, the flag bit may be removed first, and then a predetermined logic operation is performed according to the second bit stream, which is not limited herein, but the flag bit does not participate in the logic operation regardless of the logical operation.

In the embodiment of the present disclosure, by converting the first bit stream of the original decoded data into the decoded data, the flag bit information in the first bit stream is first obtained; and then determining through the flag bit, when the value of the flag bit is the value of the target bit in the first bit stream negated, the preset bit information of the negating processing in the first bit stream is obtained; performing negating processing on the preset bit in the first bit stream to obtain a second bit stream; and performing a preset logic operation according to the second bit stream and removing the flag bit to obtain decoded data. Corresponding to the data encoding method, the problem that the signal is prone to error in the transmission process is solved, the reliability of the decoded data is improved, and the signal transmission is facilitated.

Furthermore, the data decoding method may further include:

A preset logical operation is performed according to the first bit stream, and the flag bit is removed to obtain decoded data when the value of the flag bit is a value of a target bit in the first bit stream.

In the above embodiments, the descriptions of the various embodiments are all focused on, and the parts that are not detailed in a certain embodiment can be referred to the detailed description of other embodiments above. For a detailed description of the data encoding method embodiment, reference may be made to the above detailed description of the data encoding method embodiment, and details are not described herein again.

Figure 3:
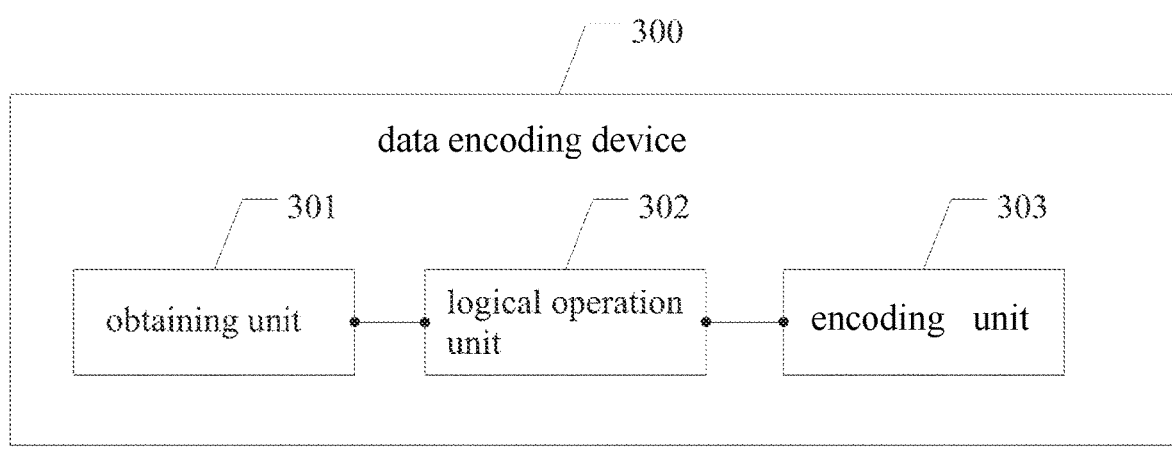
FIG. 3 is a schematic structural view of a data encoding device according to an embodiment of the present disclosure.

In order to better implement the data encoding method in the embodiment of the present disclosure, correspondingly, based on the data encoding method, as shown in FIG. 3, an embodiment of the present disclosure further provides a data encoding device, where the data encoding device 300 includes:

an obtaining unit 301 configured to obtain a first bit stream of original encoded data;

a logical operation unit 302 configured to perform a preset logical operation according to the first bit stream to obtain a second bit stream, wherein a number of bits of the second bit stream is greater than that of the first bit stream;

an encoding unit 303 configured to determine whether logical values of a plurality of consecutive preset bits in the second bit stream are the same, wherein if the logical values are the same, a logical negation is performed on the logical value of at least one bit in the middle position of the consecutive preset bits to obtain a third bit stream, and negate a target bit in the third bit stream as a flag bit, and inserting the flag bit into a first bit of the third bit stream to obtain encoded data.

Furthermore, the encoding unit 303 is further used for: inserting the target bit as the flag bit into a first bit of the second bit stream to obtain the coded data when the logical values of the consecutive preset bits in the second bit stream are different.

Furthermore, the first bit stream is 8-bit data, the second bit stream is 9-bit data, and the logical operation unit is specifically configured to:

assign a first bit of the first bit stream to a first bit of the second bit stream;

assign a second bit of the first bit stream to a second bit of the second bit stream;

negate the second bit of the first bit stream, and assigning the second bit of the first bit stream to a third bit of the second bit stream;

assign a third bit of the first bit stream to a fourth bit of the second bit stream;

negate a sixth bit of the first bit stream, and assigning the sixth bit of the first bit stream to a seventh of the second bit stream; and perform a preset logical operation according to the first bit stream to obtain a fifth bit, a sixth bit, an eighth bit, and a ninth bit of the second bit stream.

Furthermore, the logical operation unit 302 is specifically configured to:

perform a plurality of logical operations on the first bit, the second bit, and the fourth bit of the first bit stream, respectively, performing a logical OR operation on a result of the logical operations, and taking a result of the logical OR operation as the fifth bit of the second bit stream;

perform a plurality of logical operations on the first bit, the second bit, and the fifth bit of the first bit stream, respectively, performing a first logical OR operation on a result of the logical operations, and taking a result of the first logical OR operation as the sixth bit of the second bit stream;

perform a plurality of logical operations on the first bit, the second bit, and the seventh bit of the first bit stream, respectively, perform a second logical OR operation on a result of the logical operations, and take a result of the second logical OR operation as the eighth bit of the second bit stream; and perform a plurality of logical operations on the first bit, the second bit, and the eighth bit of the first bit stream, respectively, perform a third logical OR operation on a result of the logical operations, and take a result of the third logical OR operation as the ninth bit of the second bit stream.

Furthermore, the encoding unit is specifically configured to:

perform a logical NAND operation on the values of the consecutive preset bits to obtain a first operation result;

perform a logical OR operation on the values of the consecutive preset bits to obtain a second operation result; and perform a logical AND operation on the first operation result and the second operation result to obtain a third operation result;

wherein the logical values of the consecutive preset bits are different when the third operation result is 1, and the logical values of the consecutive preset bits are the same when the first operation result is 0.

The data encoding device provided in the embodiment of the present disclosure solves the problem that the signal is prone to error in the transmission process, improves the reliability of the encoded data, and facilitates signal transmission.

Figure 4:
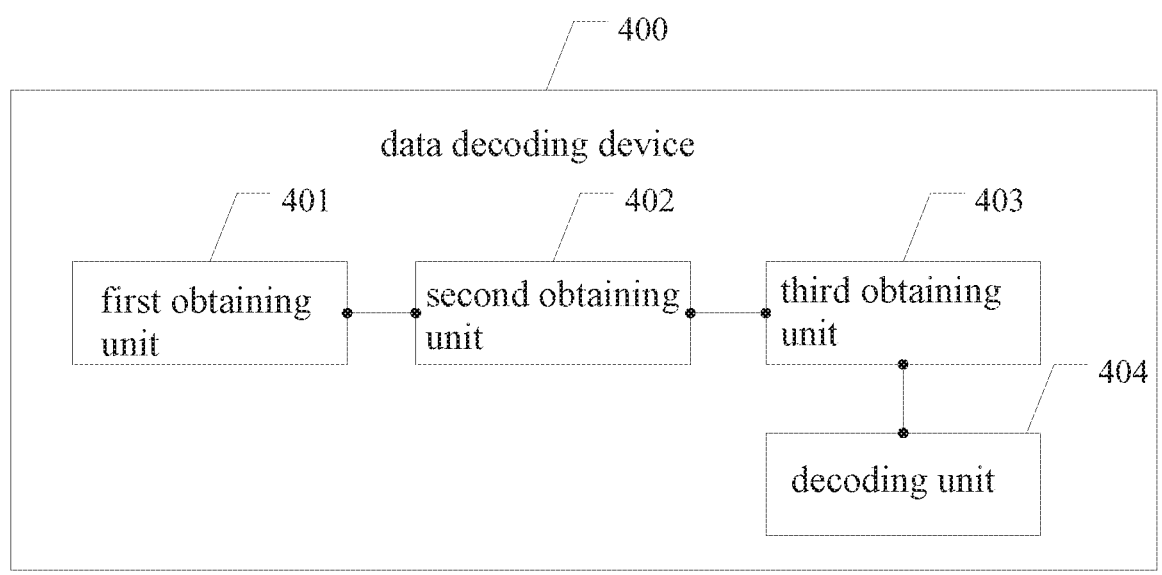
FIG. 4 is a schematic structural view of a data decoding device according to an embodiment of the present disclosure.

In order to better implement the data decoding method in the embodiment of the present disclosure, correspondingly, based on the data decoding method, as shown in FIG. 4, the embodiment of the present disclosure further provides a data decoding device, where the data decoding device 400 includes:

a first obtaining unit 401 configured to obtain a fourth bit stream corresponding to original data to be decoded;

a second obtaining unit 402 configured to obtain flag bit information in the fourth bit stream;

a third obtaining unit 403 configured to obtain preset bit information of codding and negating processing in the fourth bit stream when a value of a flag bit is a value of a target bit in the fourth bit stream negated; and a decoding unit 404 configured to perform a negating processing on a preset bit in the fourth bit stream to obtain a fifth bit stream, and perform a preset logical operation according to the fifth bit stream and removing the flag bit to obtain decoded data, wherein a number of the bits of the decoded data is greater than that of the fifth bit stream.

Furthermore, the decoding unit 404 is configured to: perform that a preset logical operation is performed according to the fourth bit stream, and the flag bit is removed to obtain decoded data when the value of the flag bit is a value of a target bit in the fourth bit stream.

The data decoding device provided in the embodiment of the present disclosure solves the problem that the signal is prone to error in the transmission process, improves the reliability of the decoded data, and facilitates signal transmission.

The application also provides a storage medium, wherein the storage medium stores a plurality of instructions adapted to be loaded by the processor to perform the steps of any of the above described methods of data encoding, or to perform the steps of any of the data decoding method embodiments.

In the specific implementation, each of the above units or structures may be implemented as an independent entity, or may be any combination, and implemented as one or several entities. For the specific implementation of the above various units or structures, refer to the foregoing method embodiments, and details are not described herein again.

For the specific implementation of the foregoing operations, refer to the foregoing embodiments, and details are not described herein again.

A data encoding method, a decoding method, a related device, and a storage medium provided by the embodiments of the present disclosure are described in detail above. The principles and embodiments of the present invention have been described with reference to specific examples. The description of the above embodiments is only for helping to understand the method of the present invention and its core ideas. In the meantime, the present invention is not limited by the scope of the present disclosure,

What is claimed is:

1. A data encoding method, comprising steps of:
   obtaining a first bit stream of original encoded data;
   performing a preset logical operation according to the first bit stream to obtain a second bit stream, wherein a number of bits of the second bit stream is greater than that of the first bit stream;
   determining whether logical values of a plurality of consecutive preset bits in the second bit stream are same, wherein if the logical values are the same, a logical negation is performed on the logical value of at least one bit in a middle position of the consecutive preset bits to obtain a third bit stream; and
   negating a target bit in the third bit stream as a flag bit, and inserting the flag bit into a first bit of the third bit stream to obtain encoded data.

2. The data encoding method according to claim 1, wherein the target bit is inserted as the flag bit into a first bit of the second bit stream to obtain coded data when the logical values of the consecutive preset bits in the second bit stream are different.

3. The data encoding method according to claim 1, wherein the first bit stream is 8-bit data, the second bit stream is 9-bit data, and the step of performing the preset logical operation according to the first bit stream to obtain the second bit stream includes:
   assigning a first bit of the first bit stream to a first bit of the second bit stream;
   assigning a second bit of the first bit stream to a second bit of the second bit stream;
   negating the second bit of the first bit stream, and assigning the second bit of the first bit stream to a third bit of the second bit stream;
   assigning a third bit of the first bit stream to a fourth bit of the second bit stream;
   negating a sixth bit of the first bit stream, and assigning the sixth bit of the first bit stream to a seventh bit of the second bit stream; and
   performing a preset logical operation according to the first bit stream to obtain a fifth bit, a sixth bit, an eighth bit, and a ninth bit of the second bit stream.

4. The data encoding method according to claim 3, wherein the step of performing the preset logical operation according to the first bit stream to obtain the fifth bit, the sixth bit, the eighth bit, and the ninth bit of the second bit stream includes:
   performing a plurality of logical operations on the first bit, the second bit, and the fourth bit of the first bit stream, respectively, performing a logical OR operation on a result of the logical operations, and taking a result of the logical OR operation as the fifth bit of the second bit stream;
   performing a plurality of logical operations on the first bit, the second bit, and the fifth bit of the first bit stream, respectively, performing a first logical OR operation on a result of the logical operations, and taking a result of the first logical OR operation as the sixth bit of the second bit stream;
   performing a plurality of logical operations on the first bit, the second bit, and the seventh bit of the first bit stream, respectively, performing a second logical OR operation on a result of the logical operations, and taking a result of the second logical OR operation as the eighth bit of the second bit stream; and
   performing a plurality of logical operations on the first bit, the second bit, and the eighth bit of the first bit stream, respectively, performing a third logical OR operation on a result of the logical operations, and taking a result of the third logical OR operation as the ninth bit of the second bit stream.

5. The data encoding method according to claim 1, wherein the step of determining whether logical values of the consecutive preset bits in the second bit stream are the same includes:
   performing a logical NAND operation on the values of the consecutive preset bits to obtain a first operation result;
   performing a logical OR operation on the values of the consecutive preset bits to obtain a second operation result; and
   performing a logical AND operation on the first operation result and the second operation result to obtain a third operation result;
   wherein the logical values of the consecutive preset bits are different when the third operation result is 1, and the logical values of the consecutive preset bits are the same when the first operation result is 0.

6. The data encoding method according to claim 1, wherein the consecutive preset bits in the second bit stream are a plurality of consecutive preset bits in a middle of the second bit stream.

7. The data encoding method according to claim 1, wherein the consecutive preset bits in the second bit stream are a plurality of consecutive preset bits in a middle and lower bit of the second bit stream.

8. A data decoding method, comprising steps of:
   obtaining a first bit stream corresponding to original data to be decoded;

obtaining flag bit information in the first bit stream;
obtaining preset bit information of encoding and negating processing in the first bit stream when a value of a flag bit is a value of a target bit in the first bit stream negated;
performing a negating processing on a preset bit in the first bit stream to obtain a second bit stream; and
performing a preset logical operation according to the second bit stream and removing the flag bit to obtain decoded data, wherein a number of bits of the decoded data is greater than that of the second bit stream.

9. The data decoding method according to claim 8, wherein the data decoding method further includes:
performing a preset logical operation according to the first bit stream, and the flag bit is removed to obtain the decoded data when the value of the flag bit is the value of the target bit in the first bit stream.

10. A data encoding device, comprising:
an obtaining unit configured to obtain a first bit stream of original encoded data;
a logical operation unit configured to perform a preset logical operation according to the first bit stream to obtain a second bit stream, wherein a number of bits of the second bit stream is greater than that of the first bit stream; and
an encoding unit configured to determine whether logical values of a plurality of consecutive preset bits in the second bit stream are same, wherein if the logical values are the same, a logical negation is performed on the logical value of at least one bit in a middle position of the consecutive preset bits to obtain a third bit stream, and negate a target bit in the third bit stream as a flag bit, and inserting the flag bit into a first bit of the third bit stream to obtain encoded data.

11. The data encoding device according to claim 10, wherein the first bit stream is 8-bit data, the second bit stream is 9-bit data, and the encoding unit is further used for:
inserting the target bit as the flag bit into a first bit of the second bit stream to obtain the coded data when the logical values of the consecutive preset bits in the second bit stream are different.

12. The data encoding device according to claim 10, wherein the logical operation unit is specifically configured to:
assign a first bit of the first bit stream to a first bit of the second bit stream;
assign a second bit of the first bit stream to a second bit of the second bit stream;
negate the second bit of the first bit stream, and assigning the second bit of the first bit stream to a third bit of the second bit stream;
assigning a third bit of the first bit stream to a fourth bit of the second bit stream;
negate a sixth bit of the first bit stream, and assigning the sixth bit of the first bit stream to a seventh bit of the second bit stream; and
perform a preset logical operation according to the first bit stream to obtain a fifth bit, a sixth bit, an eighth bit, and a ninth bit of the second bit stream.

13. The data encoding device according to claim 12, wherein the logical operation unit is specifically configured to:
perform a plurality of logical operations on the first bit, the second bit, and the fourth bit of the first bit stream, respectively, perform a logical OR operation on a result of the logical operations, and take a result of the logical OR operation as the fifth bit of the second bit stream;
perform a plurality of logical operations on the first bit, the second bit, and the fifth bit of the first bit stream, respectively, perform a first logical OR operation on a result of the logical operations, and take a result of the first logical OR operation as the sixth bit of the second bit stream;
perform a plurality of logical operations on the first bit, the second bit, and the seventh bit of the first bit stream, respectively, perform a second logical OR operation on a result of the logical operations, and take a result of the second logical OR operation as the eighth bit of the second bit stream; and
perform a plurality of logical operations on the first bit, the second bit, and the eighth bit of the first bit stream, respectively, perform a third logical OR operation on a result of the logical operations, and take a result of the third logical OR operation as the ninth bit of the second bit stream.

14. The data encoding device according to claim 10, wherein the encoding unit is specifically configured to:
perform a logical NAND operation on the values of the consecutive preset bits to obtain a first operation result;
perform a logical OR operation on the values of the consecutive preset bits to obtain a second operation result; and
perform a logical AND operation on the first operation result and the second operation result to obtain a third operation result;
wherein the logical values of the consecutive preset bits are different when the third operation result is 1, and the logical values of the consecutive preset bits are same when the first operation result is 0.

15. The data encoding device according to claim 10, wherein the consecutive preset bits in the second bit stream are a plurality of consecutive preset bits in a middle of the second bit stream.

16. The data encoding device according to claim 10, wherein the consecutive preset bits in the second bit stream are a plurality of consecutive preset bits in a middle and lower bit of the second bit stream.

17. The data encoding device according to claim 10, wherein the data encoding device includes:
a first obtaining unit configured to obtain a fourth bit stream corresponding to original data to be decoded;
a second obtaining unit configured to obtain flag bit information in the fourth bit stream;
a third obtaining unit configured to obtain preset bit information of coding and negating processing in the fourth bit stream when a value of a flag bit is a value of a target bit in the fourth bit stream negated; and
a decoding unit configured to perform a negating processing on a preset bit in the fourth bit stream to obtain a fifth bit stream, and perform a preset logical operation according to the fifth bit stream and removing the flag bit to obtain decoded data, wherein a number of the bits of the decoded data is greater than that of the fifth bit stream.

18. The data encoding device according to claim 17, wherein the decoding unit is further configured to:
perform a preset logical operation according to the fourth bit stream, and the flag bit is removed to obtain the decoded data when the value of the flag bit is the value of the target bit in the fourth bit stream.

19. The data encoding device according to claim 17, wherein the preset bits in the fourth bit stream are a plurality of consecutive preset bits.

20. The data encoding device according to claim 19, wherein the preset bits in the fourth bit stream are a plurality of consecutive preset bits being lower bits.

\* \* \* \* \*